(12) United States Patent
West et al.

(10) Patent No.: US 11,961,879 B2
(45) Date of Patent: Apr. 16, 2024

(54) IC INCLUDING CAPACITOR HAVING SEGMENTED BOTTOM PLATE

(71) Applicant: Texas Instruments Incorporated, Dallas, TX (US)

(72) Inventors: Jeffrey West, Dallas, TX (US); Mrinal Das, Allen, TX (US); Byron Williams, Plano, TX (US); Thomas Bonifield, Dallas, TX (US); Maxim Franke, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/309,999

(22) Filed: May 1, 2023

(65) Prior Publication Data

US 2023/0268377 A1    Aug. 24, 2023

Related U.S. Application Data

(62) Division of application No. 17/409,080, filed on Aug. 23, 2021, now Pat. No. 11,688,760.

(51) Int. Cl.
*H01L 23/522* (2006.01)
*H01L 23/00* (2006.01)
(Continued)

(52) U.S. Cl.
CPC .......... *H01L 28/60* (2013.01); *H01L 23/3107* (2013.01); *H01L 23/49513* (2013.01); *H01L 23/4952* (2013.01); *H01L 23/49575* (2013.01); *H01L 23/5223* (2013.01); *H01L 23/5286* (2013.01); *H01L 24/05* (2013.01); (Continued)

(58) Field of Classification Search
CPC ........... H01L 23/3107; H01L 23/49513; H01L 23/4952; H01L 23/49575; H01L 23/49589; H01L 23/5223; H01L 23/5286; H01L 24/05; H01L 24/32; H01L 24/48; H01L 24/73; H01L 28/60
See application file for complete search history.

(56) References Cited

U.S. PATENT DOCUMENTS 5,969,424 A * 10/1999 Matsuki ............ H01L 23/49816
257/737
9,601,545 B1 * 3/2017 Tu ....................... H01L 23/5223
(Continued)

*Primary Examiner* — Omar F Mojaddedi
(74) *Attorney, Agent, or Firm* — Yudong Kim; Frank D. Cimino

(57) ABSTRACT

An IC includes a substrate including circuitry configured to provide a receiver or a transmitter circuit. A metal stack is over the semiconductor surface including a top metal layer and a plurality of lower metal layers. An isolation capacitor includes the top metal layer as a top plate that is electrically connected to a first node; and a top dielectric layer on the top plate with a top plate dielectric aperture. One of the plurality of lower metal layers provides a bottom plate that includes a plurality of spaced apart segments. A capacitor dielectric layer is between the top and bottom plate. The segments include a first segment electrically connected to a second node and at least a second segment electrically connected to a third node, with separation regions located between adjacent spaced apart segments. The top plate covers at least a portion of each of the separation regions.

20 Claims, 6 Drawing Sheets

(51) Int. Cl.
*H01L 23/31* (2006.01)
*H01L 23/495* (2006.01)
*H01L 23/52* (2006.01)
*H01L 23/528* (2006.01)
*H01L 49/02* (2006.01)

(52) U.S. Cl.
CPC ............ *H01L 2224/04042* (2013.01); *H01L 2224/05025* (2013.01); *H01L 2924/1426* (2013.01)

(56) References Cited

U.S. PATENT DOCUMENTS

| | | |
|---|---|---|
| 10,366,958 B2 | 7/2019 | Bonifield et al. |
| 2004/0126981 A1 | 7/2004 | Rao et al. |
| 2012/0256193 A1 | 10/2012 | Herbert et al. |
| 2013/0082351 A1* | 4/2013 | Chen ................ H01L 28/60 257/532 |
| 2015/0214150 A1* | 7/2015 | Chang ................ H01L 23/5223 438/4 |
| 2017/0098604 A1* | 4/2017 | Ho ................ H01L 23/528 |
| 2019/0206812 A1* | 7/2019 | Bonifield ............ H01L 23/5223 |
| 2019/0378892 A1* | 12/2019 | Stewart ................ H01L 28/60 |
| 2020/0135843 A1 | 4/2020 | Ding et al. |
| 2021/0193791 A1* | 6/2021 | Kasha ................ H01L 23/5223 |
| 2021/0202375 A1 | 7/2021 | Fowler et al. |

\* cited by examiner

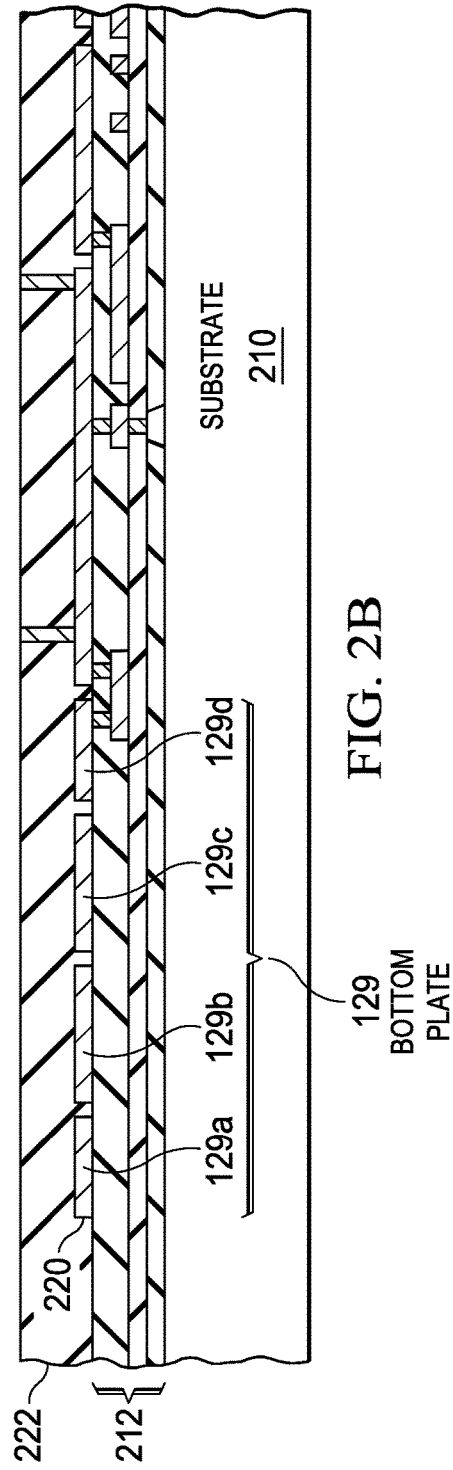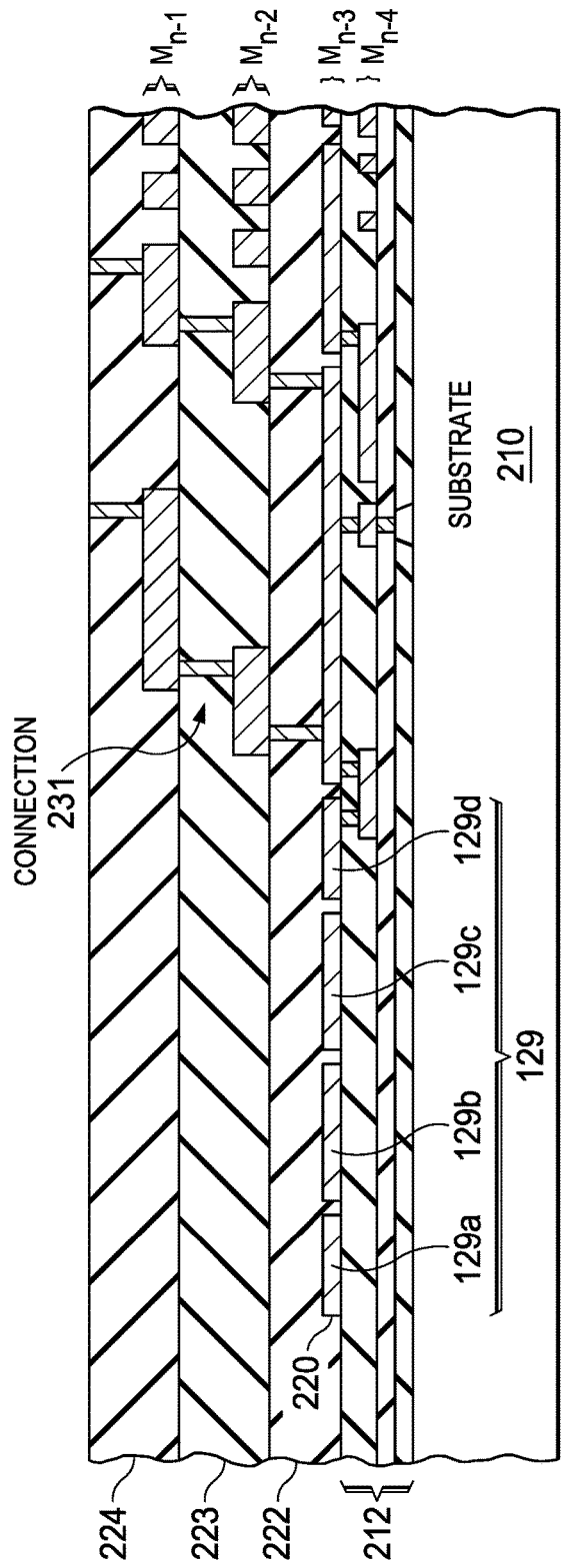

IC INCLUDING CAPACITOR HAVING SEGMENTED BOTTOM PLATE

CROSS-REFERENCE TO RELATED APPLICATIONS

The present application is a Division of U.S. patent application Ser. No. 17/409,080, filed on Aug. 23, 2021, the contents of which are herein incorporated by reference in its entirety.

FIELD

This Disclosure relates to integrated circuits (IC) that include a high voltage capacitor.

BACKGROUND

In circuit designs where high voltage (HV) or high current is present, it is generally necessary to take steps to reduce the potential risk to users of the electrical system. These steps traditionally include insulation, grounding, and the isolation of dangerous voltages and currents by galvanic isolation, being the technique of isolating functional sections of electrical systems to prevent current flow between them.

An isolation (ISO) device prevents the propagation of DC and unwanted AC currents between its input and output while allowing the transmission of the desired AC signal. The ISO device accomplishes this function using an ISO barrier that has a high breakdown voltage and low leakage. A highly resistive path generally exists across the ISO barrier, but the device can still transfer information in the desired AC signal across the ISO barrier by capacitive, inductive, or optical coupling techniques.

Basic isolation provides protection against HV damage as long as the ISO barrier is intact. Basic isolation thus needs to be coupled in series to another basic ISO barrier for safety if human access is possible. Capacitive HV ISO devices primarily use silicon-dioxide ($SiO_2$) capacitors to provide the isolation. With a dielectric strength of about 300 to 800 V/µm, $SiO_2$ has the highest dielectric strength among commonly used HV ISO dielectric materials. Silicon oxynitride or silicon nitride may also be used as part or all of the ISO capacitor's dielectric.

One common ISO device arrangement is a packaged multichip module (MCM), including at least one Rx die and a Tx die having die-to-die bonding, such as for bonding together their respective ISO capacitors to place these capacitors in a series connection. At least one of these die in the packaged MCM includes at least one embedded HV ISO capacitor that is connected in series in the data channel path. In this arrangement, the Tx die provides the input and the Rx die provides the output for the packaged MCM.

The Tx die may be on the low-voltage (LV) side of the MCM and be configured for receiving a control signal (such as a pulse width modulation (PWM) signal received from a microcontroller unit (MCU)), and the Rx die may be on the HV side and include a receiver together with a gate driver configured for driving the gates of a power transistor(s). Alternatively, there may be a first Rx die and a second Rx die each supporting one gate drive channel. The power transistors can comprise insulated gate bipolar transistors (IGBTs), bipolar junction transistors (BJTs), SiC FETs, or metal oxide field-effect transistors (MOSFETs).

The Rx die is positioned at the HV side because in a typical application the Rx die is generally connected to a DC voltage input, such as provided by a battery that may be at relatively high DC voltage, being at a higher voltage particularly during a transient. The HV ISO capacitor protects the Tx die from HV transients that may occur on the DC voltage input, and where the MCM module may be configured to operate at a high frequency and over a wide ambient temperature range.

In one particular arrangement, there are two thick $SiO_2$-based ISO capacitors connected in series between the Tx die and the Rx die by a bondwire between the input and the output, where the respective ISO capacitors together constitute a double ISO barrier. The wafer fabrication process can be a high-performance analog or complementary metal-oxide-semiconductor (CMOS) process having multiple metal layers, where the HV ISO capacitor(s) is formed between certain metal layers, and there is active circuitry formed in the semiconductor substrate or semiconductor surface (e.g., silicon) below the ISO capacitor.

Each ISO capacitor generally utilizes the top metal layer (say layer n) as its top plate and a lower metal layer (e.g., layer n−3 or a lower metal layer) as its bottom plate, where the dielectric layer for the ISO capacitor generally comprises the respective interlevel dielectric (ILD) layers stacked on one another between the bottom plate and the top plate. Each ISO capacitor also generally includes a bond pad opening on its top plate for the top plate connection, and an indirect connection to its bottom plate that is generally provided by circuitry from which the HV is being isolated, with the connection typically including metal filled vias through the ILD between adjacent metal layers. The bottom plate connector is typically connected to a digital signal generator or leads to a digital-to-analog converter depending on which direction the signal is going through the ISO capacitor on the IC which creates or reads the AC signals that propagate across the ISO barrier.

SUMMARY

This Summary is provided to introduce a brief selection of disclosed concepts in a simplified form that are further described below in the Detailed Description including the drawings provided. This Summary is not intended to limit the claimed subject matter's scope.

An IC includes an ISO capacitor referred to herein as a segmented ISO capacitor utilizing a top metal layer as its top plate and a lower metal layer as its bottom plate. The bottom plate includes a plurality of spaced apart segments so that there are separation regions between the segments, that because they are physically spaced apart are electrically isolated from one another. The top plate covers at least a portion of each of the separation regions.

Each of the bottom plate segments can be connected by a filled via or an array of filled vias immediately below the bottom plate metal that can connect to the metal level immediately below the bottom plate metal that then routes generally to a circuit(s) within the same die that uses this information. In one specific arrangement, this information is used to advantageously manipulate the output signal of a Rx die that is provided to the gate driver(s) that may drive the gates of power transistors. Alternatively, each of the bottom segments can be connected to a circuit(s) within the same die, such as by a metal line of the same metal level as the bottom plate metal.

BRIEF DESCRIPTION OF THE DRAWINGS

Reference will now be made to the accompanying drawings, which are not necessarily drawn to scale, wherein:

FIGS. 2A-2E are cross-sectional diagrams showing processing progression for an example method of forming a segmented ISO capacitor on an IC, where the segmented ISO capacitor has a conventional top plate configured to receive a bond wire, and the bottom plate is a segmented bottom plate that includes at least two electrically isolated segments to enable providing separate feedback signals, according to an example aspect.

DETAILED DESCRIPTION

Figure 1A:
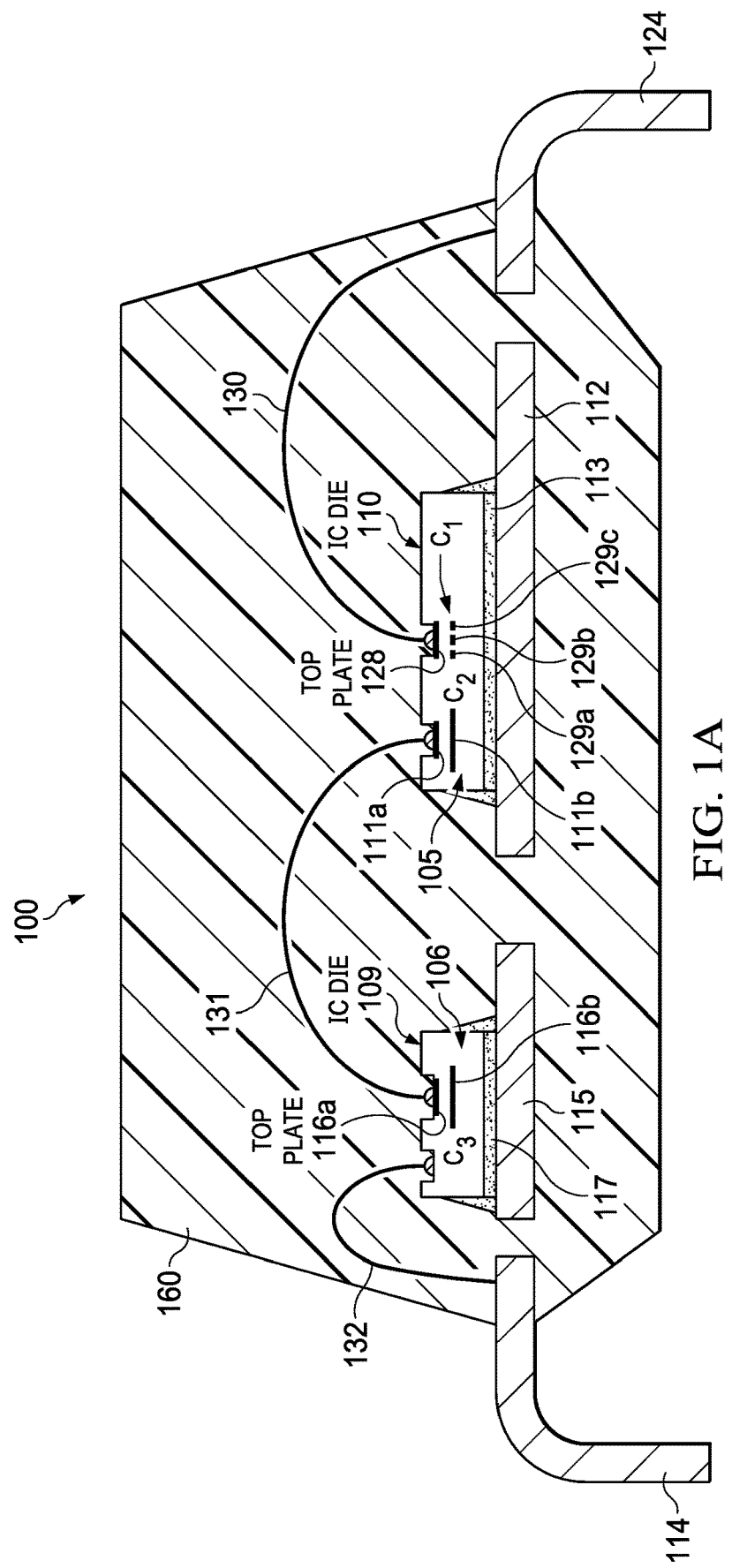
FIG. 1A is a cross sectional view of an example packaged MCM comprising a first IC die according to an example aspect having a disclosed segmented ISO capacitor and a second IC die, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connections, the intervening item generally does not modify the information of a signal but may adjust its current level, voltage level, and/or power level.

Disclosed aspects recognize for some packaged MCMs, such as in one particular arrangement having a Rx die and a Tx die, there is a benefit of providing feedback from the gate driver(s) being controlled by the HV (Rx) side output(s) which conventionally generally requires placing 2 or more separate HV ISO capacitors on the Rx die to provide 2 or more separate feedback loops. The feedback loops allow a reaction (response) to the output of the gate being driven by the gate drivers on the Rx die. HV ISO capacitors are relatively large in area, so that reducing from 2 or more separate HV ISO capacitors to one disclosed segmented HV ISO capacitor results in a significant area decrease for the Rx die. This die area decrease is accompanied by no measurable degradation in performance, including in the breakdown voltage, as compared to the use of 2 or more conventional non-segmented ISO capacitors.

FIG. 1A is a cross sectional view of an example packaged MCM 100 comprising a first IC die 109 and a second IC die 110 comprising a substrate 105 and 106, respectively, such as silicon, each die encapsulated by mold compound 160 according to an example aspect. The second IC die 110 is shown having a disclosed segmented ISO capacitor shown as $C_1$. IC die 110 and 109 are galvanically isolated by non-segmented ISO capacitors shown as $C_2$ on the second IC die 110 and $C_3$ on the first IC die 109. The respective HV ISO capacitors are connected in series by a bond wire 131. The HV ISO capacitors $C_2$ and $C_3$ can be conventional isolation capacitors that as described above have a single non-segmented bottom plate.

The first IC die 109 is mounted to a die pad 115 by a die attach material 117, and the second IC die 110 is mounted to a die pad 112 that is spaced apart and thus electrically isolated from die pad 115 by the die attach material 113. The die material 113 can be the same material as the die attach material 117. The substrates 105 and 106 can comprise silicon with an optional epitaxial top layer, or another suitable substrate material.

$C_1$ includes a top plate 128 that is shown connected by a bond wire 130 to a pin 124 which thus can connect the top plate 128 to a HV node during operation of the packaged MCM 100. As described above, the bottom plate of $C_1$ includes two or more spaced apart segments shown by example as three spaced apart segments 129a, 129b, and 129c. In one particular arrangement the segments 129a and 129c can be electrically connected to be electrically common when part of a ring (see ring 171 in FIG. 1B described below) that is grounded on the second IC die 110, where the ring surrounds the other segment(s) shown as segment 129b, where segment 129b may be considered to be an inner segment. Although three segments are shown in FIG. 1A, there can be as little as two segments, or four or more segments.

As described above, a bond pad on the second IC die 110 is connected to a bond pad on the first IC die 109 by a bond wire 131 between 2 HV ISO capacitors $C_2$ and $C_3$ which have top plates 111a and 116a, respectively, where the top plates also serve as bond pads. $C_2$ and $C_3$ may be constructed identically to $C_1$ except for the bottom plate which is non-segmented for the case of $C_2$ and $C_3$, shown as 111b and 116b, respectively, and segmented for the case of $C_1$, shown as 129a-129c. In normal operation of the packaged MCM 100, pin 114 is at a relatively low voltage, so that first IC die 109 is at the same low voltage, while pin 124 can switch between low voltage and HV. $C_2$ and $C_3$ typically have similar capacitance so that the potential on the bondwire 131 is at about half the voltage difference between pins 114 and 124. The top plate 128 of $C_1$ being connected by bond wire 130 to pin 124, can thus correspondingly switch between low voltage and HV with an external gate being driven (this aspect is described further in FIG. 3 described below).

$C_1$ generally has a capacitor dielectric layer thickness of at least 4 µm, and can generally sustain a DC voltage of at least 1,000V DC for 10 years. For example, $C_1$ can sustain a DC voltage of at least 1,000 V DC for >20 years. $C_2$ and $C_3$ may provide the same DC voltage sustaining performance. The capacitor dielectric layer can comprise multiple dielectric layers, such as a first dielectric layer on a second dielectric layer.

Figure 1B:
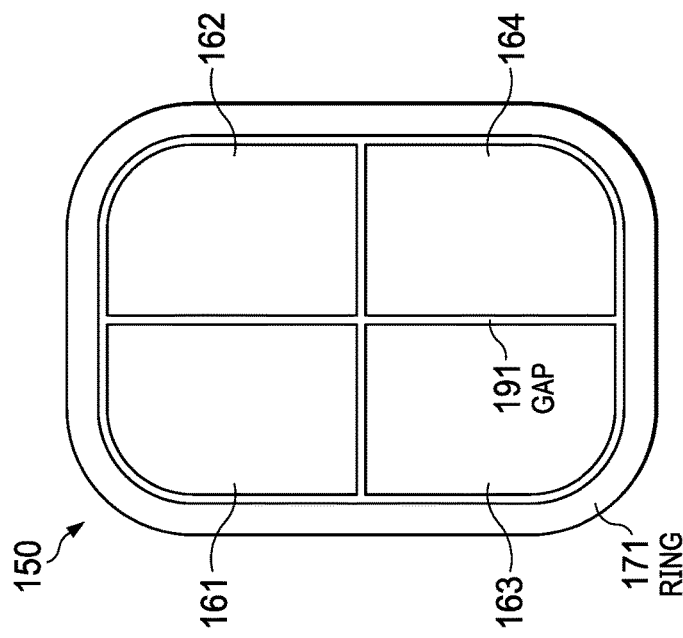
FIG. 1B shows a top view depiction of a segmented ISO capacitor including four inner segments surrounded by a ring, where there are separation regions between the segments and between the segments and the ring, according to an example aspect.

FIG. 1B shows a top view depiction of a segmented ISO capacitor 150 including four inner segments shown as 161, 162, 163 and 164, surrounded by a ring shown as 171. There are separation regions between the segments and between the segments and the ring 171, with one separation region shown as gap 191. The separation regions can have a width of 0.5 µm to 5 µm. The segments 161-164 and the ring 171 may all be formed from the same metal level.

A variety of different methods can be used to form ICs having disclosed segmented ISO capacitors. For example, FIGS. 2A-E depict in a cross-sectional view a series of example IC process fabrication steps described herein for forming an IC die including a disclosed segmented ISO capacitor capable of HV operation, such as the second IC die 110 shown in FIG. 1A. HV operation as used herein to refers to a DC voltage of at least 30 V, such as 100 V to 2 kV, typically supporting 600 V to 1 kV DC.

Figure 2A:
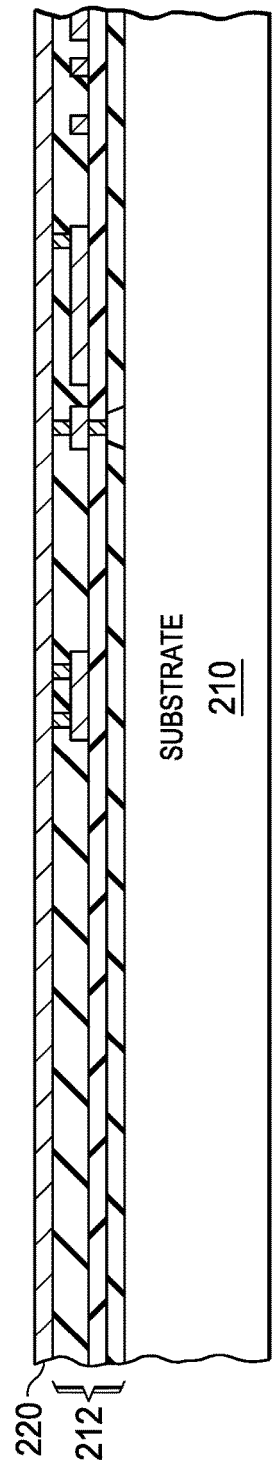

FIG. 2A illustrates in a cross-section view the structure of an in-process segmented ISO capacitor on an IC die shown at the beginning of the formation of the segmented ISO capacitor's bottom plate. Depicted in FIG. 2A is a semiconductor substrate shown as 210, and the processing layers 212 thereon that represent multiple layers formed during front end processing implemented in prior preformed conventional semiconductor processing steps, and a metal layer 220 that will provide a bottom capacitor plate for the segmented ISO capacitor. In layers 212, the prior processing steps may form various devices (not shown for simplicity) in the substrate 210, such as transistors (including MOS transistors, bipolar transistors, FETs), diodes, resistors, inductors, capacitors and the like, as well as the interconnect between them. These components also may be interconnected using metal layers and ILD layers, the metal layers being connected to one another and to the substrate 210 using filled vias and contacts to electrically connect the metal layers as in the art of semiconductor fabrication.

Metal layer 220 can be, for example, aluminum or copper, or alloys thereof, the metal being the one used in the particular semiconductor fabrication process. Single and dual damascene copper or copper alloy materials can be used to form metal layer 220. However, FIGS. 2B-2E show use of a standard subtractive-etch aluminum process integration sequence in which a layer of aluminum is photolithographically patterned, then dry-etched, then cleaned to remove residual photoresist and etch by-products to form patterned lines of a metal such as aluminum.

FIG. 2B shows the in-process segmented ISO capacitor on the IC die after patterning of metal layer 220 including to form the segmented bottom plate shown as 129 comprising spaced apart segments shown as 129a, 129b, 129c and 129d, that are electrically isolated from one another by separation regions in the metal layer 220. Segments 129a and 129d as described above can be part of a single outer ring that surrounds two or more inner segments shown here as 129b, 129c, where the ring as described above is generally tied to a ground node on the IC die or an associated packaged MCM. The deposition and subsequent planarization of an ILD layer shown as 222 follows, which also fills the separation regions between the respective segments.

FIG. 2C shows the in-process segmented ISO capacitor on an IC die after forming several interconnect levels separated by ILD comprising forming filled vias through an ILD layer, followed by forming patterned metal thereon, followed by forming another dielectric layer thereon, forming filled vias in the dielectric layer, followed by forming patterned metal, etc. In the region over the bottom plate 129 to form the segmented ISO capacitor there is only dielectric, shown as ILD layers 222, 223, and 224, wherein one arrangement the ILD layers comprise silicon oxide. The metal level providing the bottom plate 129 is shown as $M_{n-3}$, with metal level $M_{n-2}$ over $M_{n-3}$, and with metal level $M_{n-1}$ over $M_{n-2}$. A metal level below $M_{n-3}$ is shown as $M_{n-4}$. Filled vias are shown providing connections between adjacent metal levels. A vertical connection 231 is shown from a portion of the bottom metal layer 220 to a top surface of the in-process IC die.

Figure 2D:
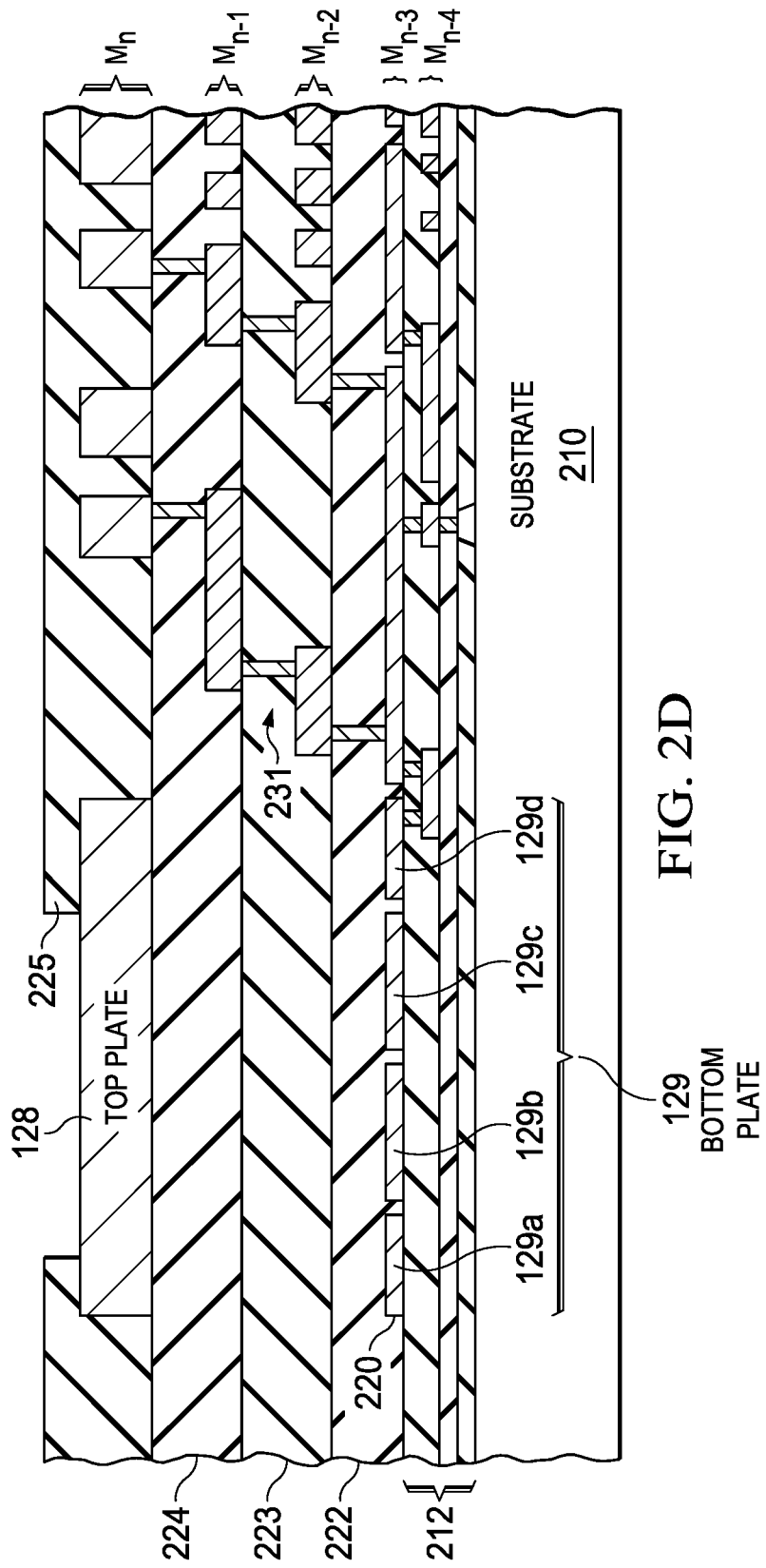
Figure 2E:
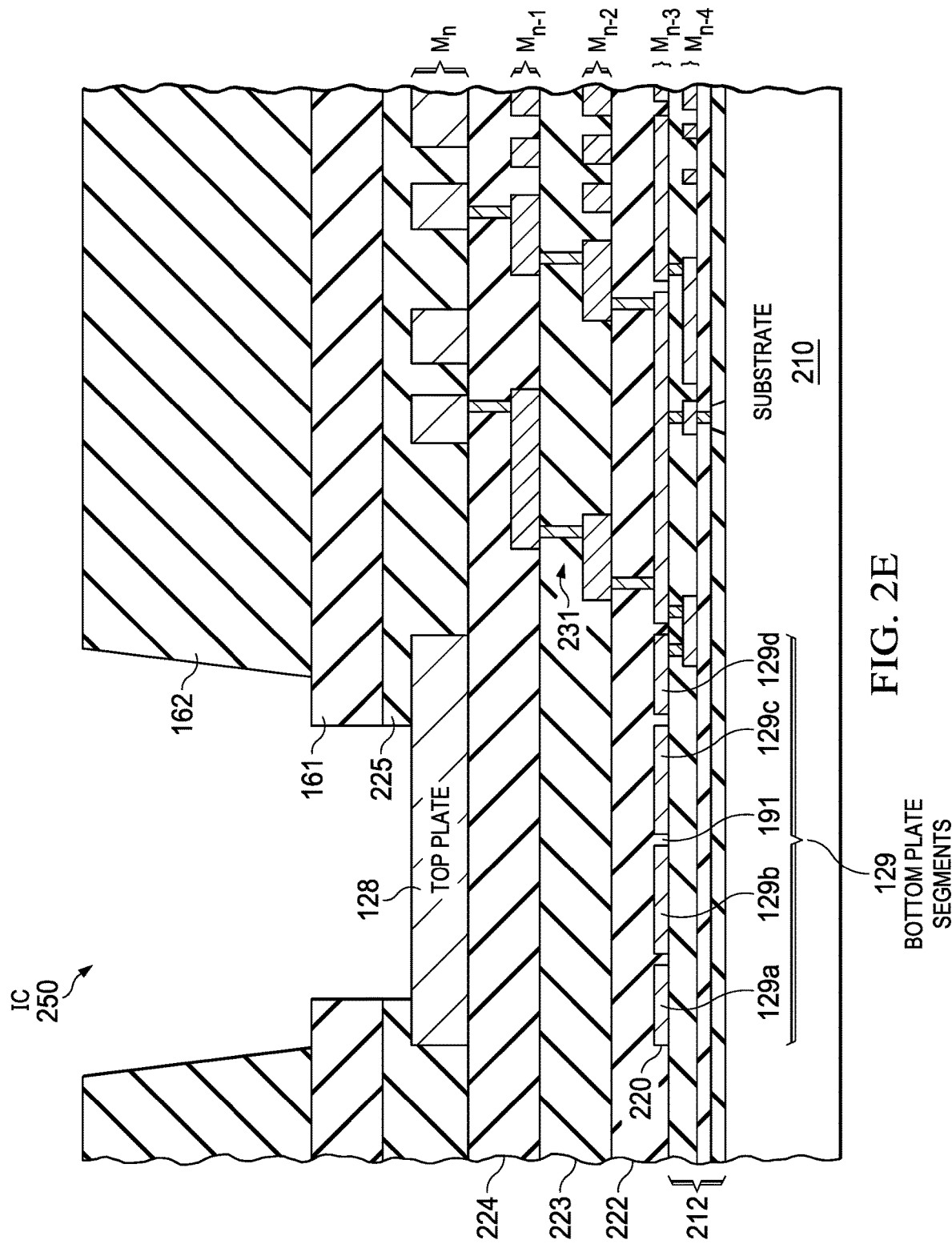

FIG. 2D shows the in-process segmented ISO capacitor on the IC die after forming a patterned top metal layer including a top plate 128, followed by planarization of a lower protective overcoat (PO) layer 225 which comprises a dielectric material. FIG. 2E shows the segmented ISO capacitor as part of an IC 250 after depositing a dielectric layer 161 which serves as an intermediate PO layer, then depositing a dielectric layer 162 which serves as a top PO dielectric layer on the dielectric layer 161. Although not shown in FIG. 2E, the IC 250 also includes circuitry (e.g., Rx circuitry) coupled to bond pads, where the bond pads are typically formed on the top metal layer ($M_n$). Separation regions 191 are also shown between the respective segments (129a, 129b, 129c, 129d) of the bottom plate collectively shown as bottom plate segments 129.

In one process flow, the PO layer stack comprising bottom PO layer 225 and the dielectric layer 161 is etched first to expose a portion of the top plate 128, then dielectric layer 162 is deposited (e.g., a polyimide (PI), generally spin-coated), then the aperture in dielectric layer 162 is formed by the PI pattern processing over the pre-existing PO aperture in bottom PO layer 225 and dielectric layer 161. As described above, in one particular arrangement, the dielectric layer 162 can comprise PI and the dielectric layer 161 can comprise a silicon oxynitride layer.

Figure 3:
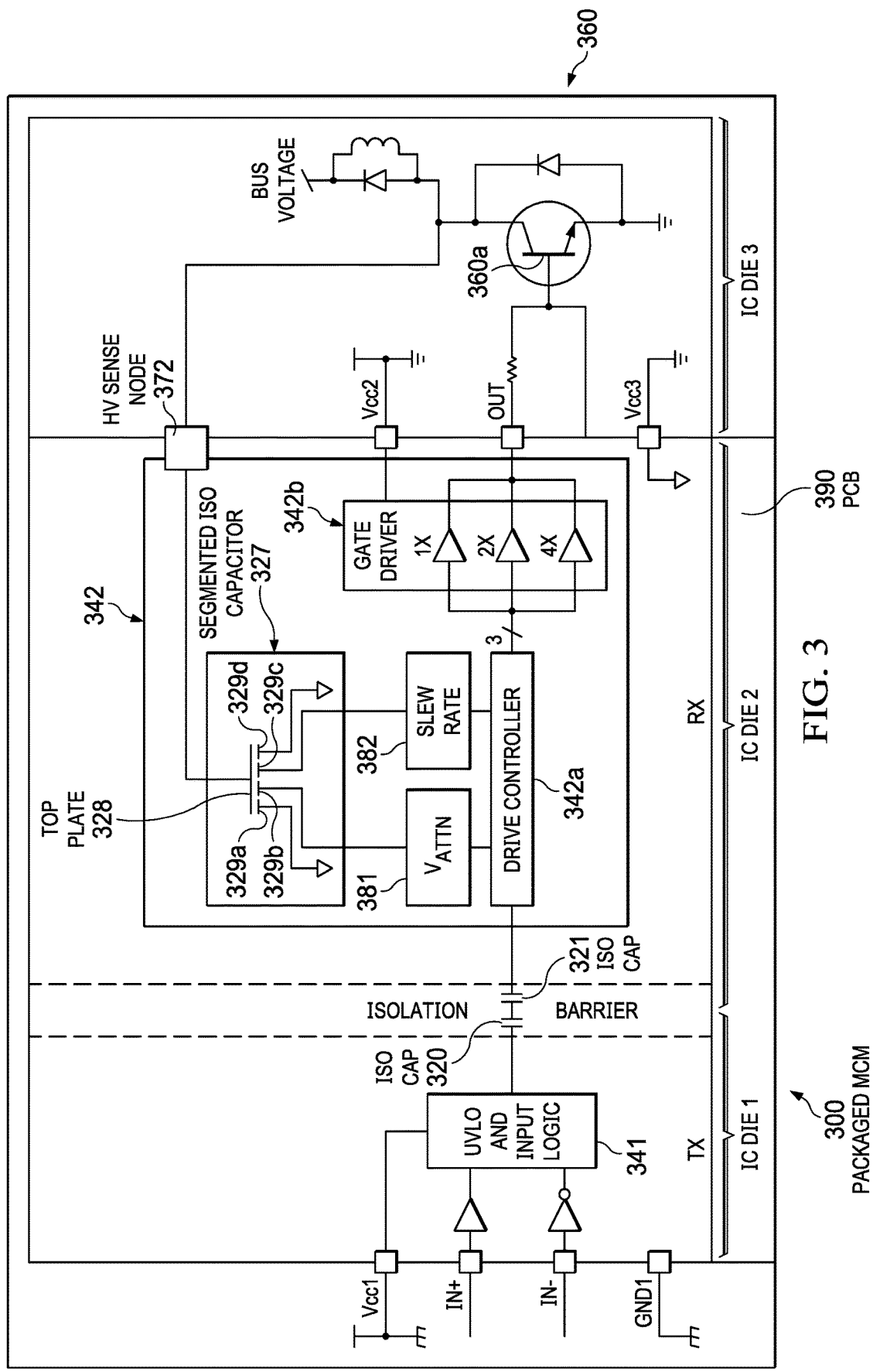
FIG. 3 shows a packaged MCM including a first die (Tx) and a second die (Rx) along with separate power transistor(s) assembled on a PCB, where one of the first die and the second die shown by example as the second die includes an IC including a disclosed segmented ISO capacitor that functions as a sense capacitor, according to an example aspect.

FIG. 3 shows a packaged MCM 300 shown by example mounted on a PCB 390, the packaged MCM 300 having eight (8) pins including a first IC die shown as IC die 1 including Tx circuitry, and IC die 2 including Rx circuitry and a disclosed segmented ISO capacitor 327. Although not shown in FIG. 3, IC die 1 and IC die 2 may be on separate die pads, such as shown in FIG. 1A described above.

IC die 1 is DC isolated from IC die 2 by a pair of ISO capacitors in series shown as ISO capacitors 320 and 321 (together providing isolation barrier) that can both be non-segmented capacitors which function to allow IC die 1 and IC die 2 to operate at different voltage domains. IC die 1 includes circuitry shown as UVLO and input logic 341, and IC die 2 includes circuitry shown as drive controller 342a (that may be referred to as being a digital controller) connected to a gate driver 342b. The gate driver 342b can use the slew rate information from slew rate sensing block 382 to control a plurality of its binary weighted gate drivers for various functions including adjusting the slew rate of the HV sense node 372 edges, or turning on all the gate drivers in gate driver 342b once the HV sense node 372 has been pulled sufficiently low.

The output of the packaged MCM 300 shown as OUT is electrically coupled to at least one gate or other controller of a power transistor module generally on a third IC die shown as IC die 3, that is also mounted on the PCB 390. IC die 3 is shown for simplicity comprising a gate 360a of a single BJT 360 shown as an npn bipolar transistor. The collector of the BJT 360 is identified as the HV sense node 372 that tracks the "bus voltage" shown, which may be considered a HV supply rail for IC die 2, which in one specific application arrangement varies between 0 V and 1,400 V, where the HV sense node 372 is electrically connected (typically by metal connection) to the top plate 328 of the segmented ISO capacitor 327.

The segmented ISO capacitor 327 also includes a bottom plate that comprises a plurality of spaced apart segments shown as 329a, and 329b. As described above there may also be other segments that are part of a ring, where these segments can be electrically connected to one another, and the ring can be connected to the ground pin for the packaged MCM 300 marked as being GND1. Segments 329a and 329b are used for sensing the HV sense node 372, shown by example as a slew rate sensing block 382 for sensing the change of voltage with respect to time (dv/dt) at the HV sense node 372, and a voltage attenuation block ($V_{ATTN}$) 381 for attenuating the voltage at the HV sense node 372 before it reaches the drive controller 342a.

The segmented ISO capacitor 320, by having a bottom plate with separate segments 329a, 329b, provides separate (independent) feedback paths (e.g., using metal connectors along with metal filled vias from the HV sense node 372 to the respective blocks 381, 382. The drive controller 342a uses the slew rate and $V_{ATTN}$ information to modify the Tx input to the gate driver 342b to achieve a desired modification to the output waveform from the Rx circuit. The modified output waveform is provided at the output (OUT) pin of the packaged MCM 300.

The HV sense node 372 (controlled by the bus voltage) behavior is thus detected with a combination of the segmented ISO capacitor 327, the $V_{ATTN}$ block 381, and the slew rate sensing block 382. The $V_{ATTN}$ block 381 will relay an attenuated, low voltage version of the voltage at the HV sense node 372 to the drive controller 342a. The slew rate sensing block 382 will relay the slew rate information of the HV sense node 372 to the drive controller 342a. The drive controller 342a can use the slew rate information to control the 3 binary weighted gate drivers shown as gate driver 342b to perform various functions including adjusting the slew of the HV sense node 372 edges, or turning on all the gate drivers 342b once the HV sense node 372 has been pulled sufficiently low.

Disclosed aspects can be used to form ICs and MCM modules that may utilize a variety of assembly flows to form a variety of different IC devices. The semiconductor die utilized in disclosed packaged MCMs may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, SiC FET, GaN, BiCMOS and MEMS.

Those skilled in the art to which this Disclosure relates will appreciate that many other aspects and variations of aspects are possible within the scope of the claimed invention, and further additions, deletions, substitutions and modifications may be made to the described aspects without departing from the scope of this Disclosure.

What is claimed is:

1. A method of forming an integrated circuit (IC), comprising:
    forming stacked metal layers on a semiconductor substrate including circuitry with nodes, the stacked metal layers including a first metal layer and a second metal layers located under the first metal layer; and
    forming a segmented isolation capacitor, including:
        forming a bottom plate of the segmented isolation capacitor based on the second metal layer, the bottom plate including a plurality of spaced apart segments, wherein a first segment of the plurality of spaced apart segments is electrically connected to a first node of the nodes, and wherein a second segment of the plurality of spaced apart segments is electrically connected to a second node of the nodes;
        forming a capacitor dielectric layer of the segmented isolation capacitor over the bottom plate; and
        forming a top plate of the segmented isolation capacitor based on the first metal layer, the top plate covering at least a portion of the plurality of spaced apart segments, wherein the top plate is electrically connected to a third node of the nodes.

2. The method of claim 1, wherein the IC further comprises another isolation capacitor.

3. The method of claim 1, further comprising:
    forming an isolation ring based on the second metal layer, the isolation ring surrounding the plurality of spaced apart segments, wherein the isolation ring is electrically connected to a ground of the IC.

4. The method of claim 1, further comprising:
    forming a top dielectric layer over the top plate, wherein the top dielectric layer includes an aperture exposing a portion of the top plate.

5. The method of claim 4, wherein the top dielectric layer comprises a first dielectric layer on a second dielectric layer.

6. The method of claim 1, wherein the first metal layer corresponds to a topmost metal layer of the stacked metal layers.

7. The method of claim 1, wherein the circuitry includes a receiver circuit or a transmitter circuit.

8. A method, comprising:
    forming a bottom plate of a segmented capacitor using a first metal layer over a semiconductor substrate including circuitry with nodes, wherein:
        the bottom plate includes a plurality of spaced apart segments;
        a first segment of the plurality of spaced apart segments is electrically connected to a first node of the nodes; and
        a second segment of the plurality of spaced apart segments is electrically connected to a second node of the nodes;
    forming a dielectric layer of the segmented capacitor over the bottom plate; and
    forming a top plate of the segmented capacitor over the dielectric layer using a second metal layer, wherein:
        the top plate is electrically connected to a third node of the nodes; and
        the top plate covers at least a portion of the plurality of spaced apart segments.

9. The method of claim 8, wherein forming the bottom plate includes forming an isolation ring using the first metal layer, wherein:
    the isolation ring surrounds the plurality of spaced apart segments; and
    the isolation ring is electrically connected to a ground of the circuitry.

10. The method of claim 8, wherein the second metal layer is a topmost metal layer of a plurality of metal layers over the semiconductor substrate.

11. The method of claim 8, wherein the dielectric layer includes a first dielectric layer on a second dielectric layer.

12. The method of claim 8, wherein the dielectric layer is a first dielectric layer, the method further comprising:
    forming a second dielectric layer over the top plate, wherein the second dielectric layer includes an aperture exposing a portion of the top plate.

13. The method of claim 8, wherein the segmented capacitor is a first capacitor, the method further comprising forming a second capacitor over the semiconductor substrate.

14. The method of claim 8, wherein the circuitry includes a receiver circuit or a transmitter circuit.

15. The method of claim 8, wherein at least two adjacent segments of the plurality of spaced apart segments are separated by a gap ranging between 0.5 µm to 5 µm.

16. The method of claim 8, wherein the segmented capacitor has a total capacitance of 10 to 1,000 fF.

17. The method of claim 8, wherein a thickness of the dielectric layer is at least 4 µm.

18. The method of claim 8, wherein the dielectric layer includes silicon dioxide.

19. The method of claim 8, further comprising:
    connecting a bond wire between the top plate and a pin external to the semiconductor substrate.

20. The method of claim 19, further comprising:
    encapsulating the semiconductor substrate, the segmented capacitor, and the bond wire using a mold compound.

* * * * *